United States Patent [19]

Hong

[11] Patent Number: 5,699,854

[45] Date of Patent: Dec. 23, 1997

[54] MINIATURE FAN ASSEMBLY FOR OUTPUTTING AIR IN A CERTAIN DIRECTION

[76] Inventor: Chen Fu-In Hong, No. 3, Lane 45, Yi-Yung Road, Lin-Ya District, Kaohsiung, Taiwan

[21] Appl. No.: 745,859

[22] Filed: Nov. 8, 1996

[51] Int. Cl.⁶ .................................................. F24H 3/02
[52] U.S. Cl. ............................................ 165/121; 165/122
[58] Field of Search ........................... 415/206; 165/121, 165/122

[56] References Cited

U.S. PATENT DOCUMENTS

| | | | |
|---|---|---|---|
| 3,592,260 | 7/1971 | Berger | 165/121 |
| 5,377,745 | 1/1995 | Hsieh | 165/121 |
| 5,421,402 | 6/1995 | Lin | 165/121 |
| 5,437,327 | 8/1995 | Chiou | 165/122 |
| 5,484,013 | 1/1996 | Morikawa et al. | 165/122 |
| 5,522,700 | 6/1996 | Hong . | |
| 5,526,875 | 6/1996 | Lin | 165/122 |

*Primary Examiner*—John T. Kwon
*Attorney, Agent, or Firm*—Bacon & Thomas

[57] ABSTRACT

A miniature fan assembly includes a base, a coil seat mounted in the base, a fan mounted above the coil seat, and a top plate securely mounted above the fan. The base includes a recess defined therein and an outlet defined in a peripheral wall thereof which defines the recess. The coil seat and the peripheral wall of the base together define a helical air passage therebetween. The coil seat further includes an axle hole defined therein and a coil mounted therearound. The fan includes a head portion with a peripheral wall and a plurality of fan blades extending outwardly from the peripheral wall of the head portion. The fan further includes an axle which is rotatably received in the axle hole of the coil seat. The peripheral wall of the head portion defines a hollow interior therein for accommodating the coil seat.

9 Claims, 3 Drawing Sheets

5,699,854

MINIATURE FAN ASSEMBLY FOR OUTPUTTING AIR IN A CERTAIN DIRECTION

BACKGROUND OF THE INVENTION

1. Field of the Invention

The present invention relates to a miniature fan assembly which may output air in a certain direction to provide a better heat dissipating effect.

2. Description of the Related Art

Applicant's U.S. Pat. No. 5,522,700 entitled "FAN DEVICE FOR INTEGRATED CIRCUIT" discloses a fan device for dissipating heat from an electric component which includes a base with fins extending upwardly therefrom and a board secured above the fins and including a number of orifices for air circulation purposes. The board includes a support engaged in an opening and coupled to the board for securing a fan.

Nevertheless, the air outputted by such axial type fan has a large air flow and a low air pressure such that the air, when outputted, disperses and thus cannot provide the required heat dissipation effect. In addition, there are limitations in the position and height during installation of the axial type fan. The present invention is intended to provide a miniature fan assembly which mitigates and/or obviates the above problems.

SUMMARY OF THE INVENTION

It is an object of the present invention to provide a miniature fan assembly which may output air in a certain direction and which includes only one outlet for enforcing the air output effect.

It is another object of the present invention to provide a miniature fan assembly which may be quickly assembled.

It is a further object of the present invention to provide a miniature fan assembly in which the electric wires for the fan are prevented from being damaged by an external force or the fan blades.

A miniature fan assembly in accordance with the present invention generally comprises a base, a coil seat, a fan, and a top plate. The base includes a recess defined therein and an outlet defined in a peripheral wall thereof which defines the recess. The coil seat is mounted in the recess of the base. The coil seat and the peripheral wall of the base together define a helical air passage therebetween. The coil seat further includes an axle hole defined therein and a coil mounted therearound.

The fan is mounted above the coil seat. The fan includes a head portion with a peripheral wall and a plurality of fan blades extending outwardly from the peripheral wall of the head portion. The fan further includes an axle which is rotatably received in the axle hole of the coil seat. The peripheral wall of the head portion defines a hollow interior therein for accommodating the coil seat. The top plate is mounted above the fan, and means is provided for securely engaging the base with the top plate.

Preferably, each fan blade (preferably of axial type) extends in an angle of 45 degrees with respect to the peripheral wall of the head portion of the fan. Each fan blade may have a concave underside which faces the coil.

A bottom wall defining the recess of the base includes a second recess defined therein, and a wire channel is defined in the bottom wall of the base and includes a first end in communication with the second recess and a second end in communication with an environment. An electric wire is extended through the wire channel and has a first end electrically connected to the coil and a second end adapted to be electrically connected to a power source. Preferably, the wire channel is defined in the peripheral wall of the base at a position where the air enters the base.

In a preferred embodiment of the invention, wherein a lip is formed on an outlet end of the electric wire which is adjacent to the environment, and the lip has a height smaller than that of the peripheral wall and such that the electric wire turns before exiting the base. The top plate may include a retaining member extending downwardly from the underside thereof. The retaining member is received in the wire channel and retains the electric wire in position and blocks the outlet end of the electric wire.

The coil seat may include an axle tube formed on an underside thereof, and a second bottom wall which defines the second recess may include a flanged passage formed therein for fittingly receiving the axle tube.

In a preferred embodiment of the invention, the means for engaging the base with the top plate may include a plurality of hooks extending downwardly form an underside of the top plate and a plurality of engaging notches defined in the peripheral wall of the base, wherein the hooks are extended through the associated engaging notches with a distal end of each said hook bearing against an underside of the base.

Other objects, advantages, and novel features of the invention will become more apparent from the following detailed description when taken in conjunction with the accompanying drawings.

DESCRIPTION OF THE PREFERRED EMBODIMENT

Figure 1:
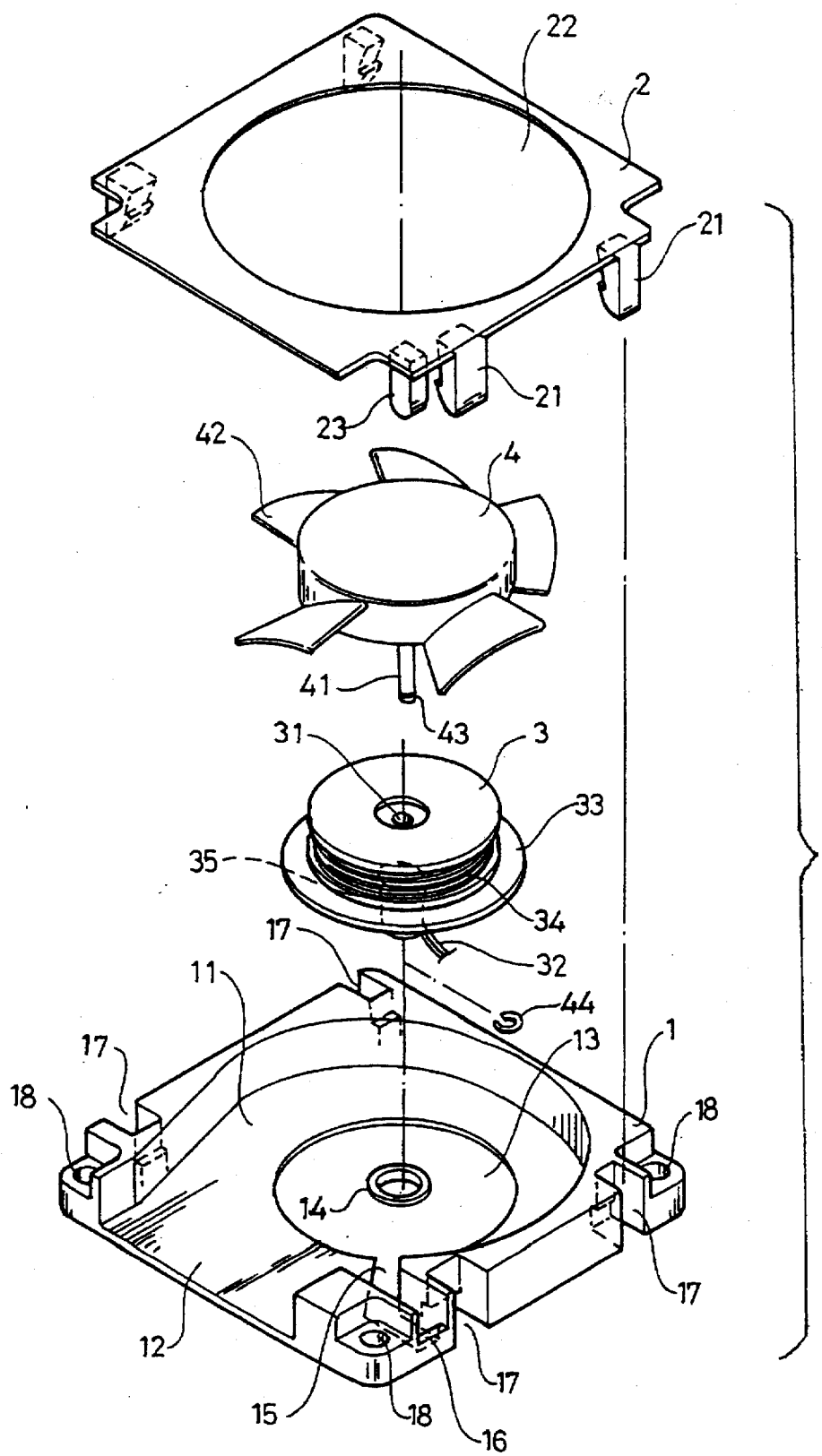
FIG. 1 is an exploded view of a miniature fan assembly in accordance with the present invention.

Referring to the drawings and initially to FIG. 1, a miniature fan assembly in accordance with the present invention generally includes a base 1, a top plate 2, a coil seat 3, and a fan 4. The base 1 includes a first recess 11 defined therein and an outlet 12 defined in a first side wall of a peripheral wall thereof which defines part of the first recess 11. A first bottom wall defining the remaining part of the first recess 11 includes a second recess 13 defined therein, and a second bottom wall defining the second recess 13 includes a flanged passage 14 defined therein. In addition, a plurality of engaging notches 17 are defined in the peripheral wall of the base 1. A wire channel 15 is defined in the first bottom wall and includes an inner end in communication with the first and second recesses 11 and 13 and an outer end in communication with the environment. In addition, a lip 16 is formed on an outlet end of the wire channel 15, and the height of the lip 16 is preferably smaller than that of the peripheral wall of the base 1. The base 1 may be secured in an appropriate position above an integrated circuit (not shown) by screws (not shown) extending through a plurality of holes 18 defined in the peripheral wall thereof, which is conventional and therefore not further described.

The top plate 2 includes a plurality of hooks 21 extending downwardly from an underside thereof. The hooks 21 may be extended through the engaging notches 17 with a distal end of each hook 21 bearing against an underside of the base 1, thereby securing the base 1 and the top plate 2 together, and thereby enclosing the fan 4 and the coil seat 3 therein (see FIG. 3). The top plate 2 further includes an opening 22 for induction of cool air into the fan assembly. A retaining member 23 extends downwardly from the underside of the top plate 2, which will be described later.

The coil seat 3 is mounted in the base 1 and includes a circuit board 33 at a bottom thereof. An axle tube 35 is formed on an underside of the coil seat 3, and an axle hole 31 is defined in the coil seat 3 and in alignment with a hollow interior of the axle tube 35. A coil 34 is mounted around the coil seat 3 and may generate a magnetic field to urge the fan 4 to rotate. An electric wire 32, which electrically interconnects the coil 34 and a power source (not shown), is guided outside the base 1 via the wire channel 15.

The fan 4 includes a plurality of fan blades 42 and an axle 41 which extends through the axle hole 31 and the axle tube 35 and which is then retained in position by a C-clip 44 fitted into a circumferential groove 43 defined in a distal end of the axle 41. Preferably, each fan blade 42, preferably of an axial type, extends in an angle (preferably 45 degrees) with respect to a peripheral wall of a head portion of the fan 4. Preferably, each fan blade 42 has a concave underside (see FIG. 1) which faces the coil 34. In addition, the peripheral wall of the head portion defines a hollow interior 45 therein for accommodating the coil seat 3, thereby providing a minimized thickness.

Figure 2:
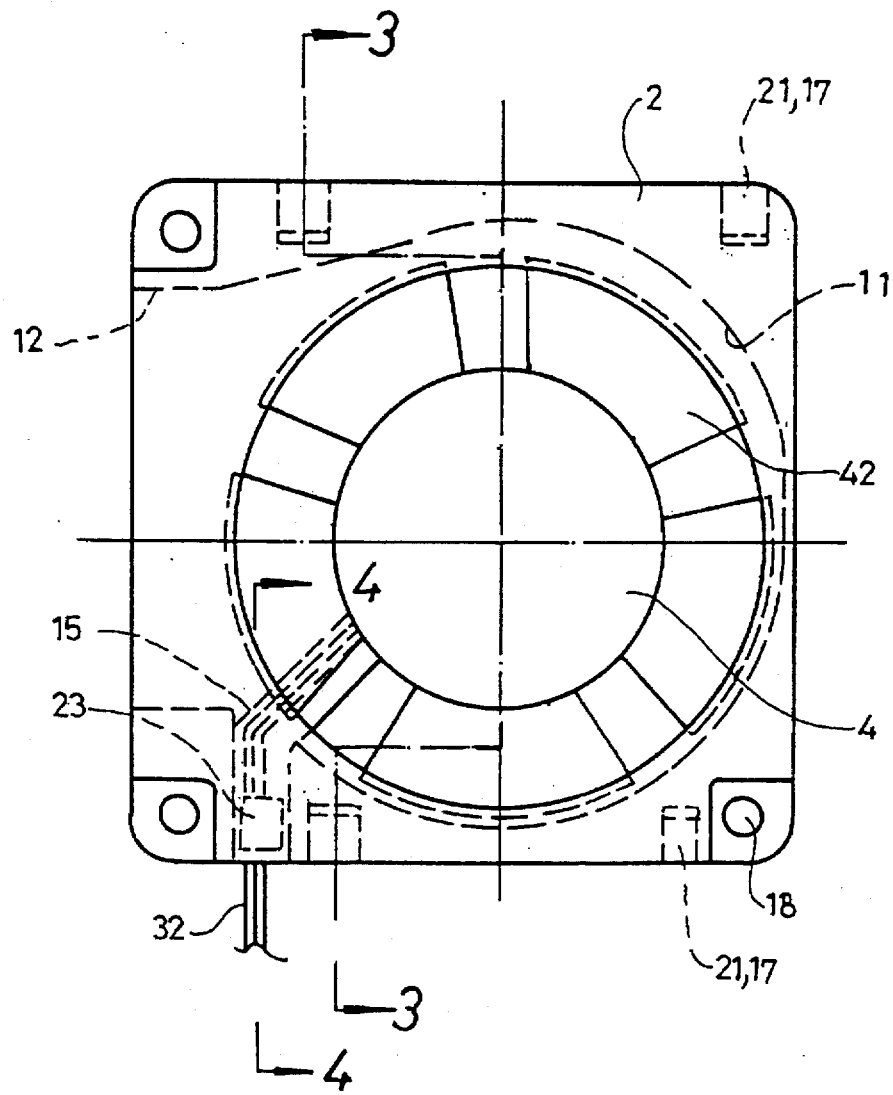
FIG. 2 is a top plan view of the miniature fan assembly in accordance with the present invention.
Figure 3:
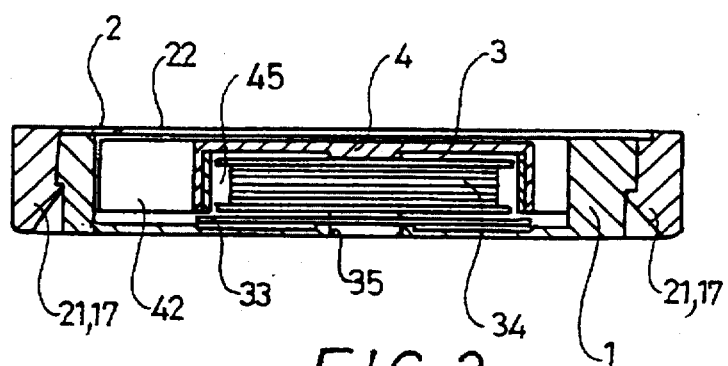
FIG. 3 is a cross-sectional view taken along line 3—3 in FIG. 2.
Figure 4:
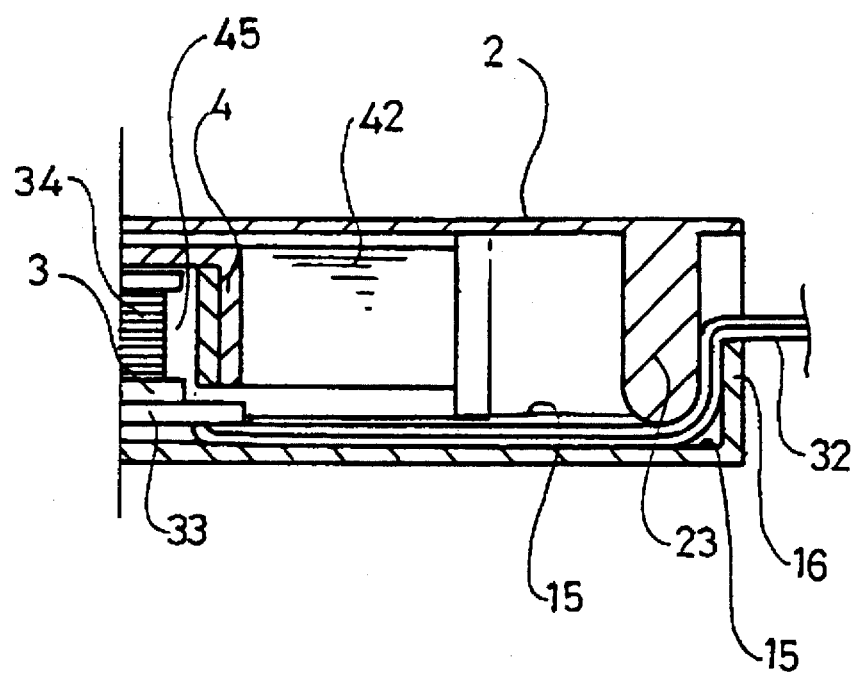
FIG. 4 is a cross-sectional view taken along line 4—4 in FIG. 2.

In assembly, referring to FIGS. 1 to 3, the coil seat 3 is received in the first recess 11 of the base 1 and the circuit board 33 of the coil seat 3 is received in the second recess 13 of the base 1, and wherein the axle tube 35 is fittingly received in the flanged passage 14, as shown in FIG. 2. Referring to FIGS. 2 and 4, the electric wire 32 is extended to the environment via the wire channel 15 and is retained in position by the retaining member 23 of the top plate 2. In addition, the electric wire 32 turns before exiting the base 1 due to provision of the lip 16, as clearly shown in FIG. 4. By such an arrangement, the electric wire 32 is securely retained in position and thus will not be damaged by the rotating fan blades 42 and/or by an external force. In addition, disconnection in the connecting points of the electric wire 32 and the coil 34 is also avoided. Furthermore, after assembly, the fan assembly provides a helical air groove and only one air outlet, thereby providing excellent heat dissipation effect as the air flow is relatively large. Preferably, the wire channel 15 is defined in the peripheral of the base at a position where air enters the base 1.

According to the above description, the present invention provides a miniature fan assembly which has a relatively small thickness and which may output air in the required manner as having only one outlet. In addition, the electric wire is avoided from being damaged as it is securely retained in position by the retaining member 23 on the top plate 2.

Although the invention has been explained in relation to its preferred embodiment, it is to be understood that many other possible modifications and variations can be made without departing from the spirit and scope of the invention as hereinafter claimed.

What is claimed is:

1. A miniature fan assembly, comprising:

a base having a peripheral wall bounding a first recess, a bottom wall of the first recess having a second recess defined therein, and a wire channel being defined in the bottom wall of the base and including a first end in communication with the second recess and a second end in communication with an environment, and an electric wire extending through the wire channel and having a first end and a second end adapted to be electrically connected to a power source;

a coil seat mounted in the first recess of the base, the coil seat and the peripheral wall of the base together defining a helical air passage therebetween, the coil seat including an axle hole defined therein and a coil mounted therearound the first end of the electric wire electrically connected to the coil;

a fan mounted above the coil seat, the fan including a head portion with a peripheral wall and a plurality of fan blades extending outwardly from the peripheral wall of the head portion, the fan further including an axle which is rotatably received in the axle hole of the coil seat, the peripheral wall of the head portion defining a hollow interior therein for accommodating the coil seat;

a top plate mounted above the fan; and means for securely engaging the base with the top plate.

2. The miniature fan assembly according to claim 1, wherein each said fan blade extends in an angle of 45 degrees with respect to the peripheral wall of the head portion of the fan.

3. The miniature fan assembly according to claim 1, wherein the fan blades are of axial type.

4. The miniature fan assembly according to claim 1, wherein each said fan blade has a concave underside which faces the coil.

5. The miniature fan assembly according to claim 1, wherein the wire channel is defined in the peripheral wall of the base at a position wherein the air enters the base.

6. The miniature fan assembly according to claim 5, wherein a lip is formed on an outlet end of the electric wire which is adjacent to the environment, and the lip has a height smaller than that of the peripheral wall and such that the electric wire turns before exiting the base.

7. The miniature fan assembly according to claim 6, wherein the top plate includes a retaining member extending downwardly from the underside thereof, said retaining member is received in the wire channel and retains the electric wire in position and blocks the outlet end of the electric wire.

8. The miniature fan assembly according to claim 1, wherein the coil seat includes a axle tube formed on an underside thereof, and a second bottom wall which defines the second recess includes a flanged passage formed therein for fittingly receiving the axle tube.

9. The miniature fan assembly according to claim 1, wherein the means for engaging the base with the top plate includes a plurality of hooks extending downwardly form an underside of the top plate and a plurality of engaging notches defined in the peripheral wall of the base, wherein the hooks are extended through the associated engaging notches with a distal end of each said hook bearing against an underside of the base.

* * * * *